(12) United States Patent
Miyazaki

(10) Patent No.: US 6,580,076 B1
(45) Date of Patent: Jun. 17, 2003

(54) MICRO-MANIPULATION METHOD

(75) Inventor: Hideki Miyazaki, Ibaraki (JP)

(73) Assignee: Japan Science and Technology Corporation, Saitama-Ken (JP)

(*) Notice: Subject to any disclaimer, the term of this patent is extended or adjusted under 35 U.S.C. 154(b) by 149 days.

(21) Appl. No.: 09/856,430

(22) PCT Filed: Aug. 25, 2000

(86) PCT No.: PCT/JP00/05759
§ 371 (c)(1),
(2), (4) Date: May 21, 2001

(87) PCT Pub. No.: WO01/21526
PCT Pub. Date: Mar. 29, 2001

(30) Foreign Application Priority Data

Sep. 24, 1999 (JP) .............................. 11-269778

(51) Int. Cl.$^7$ ................... G21K 7/00; G21K 5/08; G21K 5/10; G21G 5/00
(52) U.S. Cl. .................. 250/311; 250/306; 250/307; 250/310; 250/492.2; 250/492.3
(58) Field of Search ................. 294/2, 103.1, 99.1, 294/740; 250/311, 306, 307, 310, 398, 399, 400, 440.11, 442.11, 492.2, 492.3

(56) References Cited

U.S. PATENT DOCUMENTS

| | | | | |
|---|---|---|---|---|
| 3,740,133 A | * | 6/1973 | Komori et al. | 399/203 |
| RE29,186 E | * | 4/1977 | Komori et al. | 355/8 |
| 4,166,562 A | * | 9/1979 | Keizer et al. | 228/5.1 |
| 5,006,795 A | * | 4/1991 | Yoshizawa et al. | 324/751 |
| 5,163,728 A | * | 11/1992 | Miller et al. | 294/99.1 |
| 5,325,261 A | * | 6/1994 | Horwitz | 361/234 |
| 5,711,647 A | * | 1/1998 | Slocum | 414/751.1 |
| 5,852,298 A | * | 12/1998 | Hatakeyama et al. | 250/492.2 |
| 5,857,456 A | * | 1/1999 | Sun et al. | 128/203.15 |
| 6,049,650 A | * | 4/2000 | Jerman et al. | 385/137 |
| 6,473,553 B1 | * | 10/2002 | Jerman et al. | 385/137 |

FOREIGN PATENT DOCUMENTS

| | | | | |
|---|---|---|---|---|
| DE | 4216218 A1 | * | 11/1992 | ......... H01L/21/68 |
| EP | 1160192 A1 | * | 12/2001 | ......... B81C/5/00 |
| JP | 50-115971 | | 9/1975 | |
| JP | 04264348 A | * | 9/1992 | ......... H01J/49/26 |
| JP | 05-205688 | | 8/1993 | |
| JP | 08195181 A | * | 7/1996 | ......... H01J/37/22 |
| JP | 08318481 A | * | 12/1996 | ......... B25J/7/00 |
| JP | 11067139 A | * | 3/1999 | ......... H01J/37/244 |
| JP | 11-174008 | | 7/1999 | |

* cited by examiner

Primary Examiner—John R. Lee
Assistant Examiner—Bernard E. Souw
(74) Attorney, Agent, or Firm—Rader, Fishman & Grauer PLLC

(57) ABSTRACT

A micro-manipulation method enables micro-objects to be handled as desired with excellent repeatability when using microscopes that radiate electron beams and use secondary, reflected and transmitted electron signals to magnify objects for observation. For micro-manipulation of micro-objects with a micro-handling tool under electron beam irradiation of an electron microscope, there is a means to adjust the accelerating voltage of the electron beam, the potential of the micro-handling tool and the potential of the work substrate, thereby enabling the effective pick up and release of micro-objects with the micro-handling tool.

4 Claims, 2 Drawing Sheets

| Accelerating voltage | 0 ~ V1 | V1 | V1 ~ V2 | V2 | V2 ~ V3 | V3 | V3 ~ |
|---|---|---|---|---|---|---|---|
| Charge polarity | negative | 0 | positive | 0 | negative | 0 | positive |

MICRO-MANIPULATION METHOD

TECHNICAL FIELD

This invention relates to a micro-manipulation method for handling a micro-object which is designed with excellent repeatability in a microscope that radiates electron beams and uses secondary electron, reflected electron and transmitted electron signals to magnify an object for observation.

BACKGROUND OF THE INVENTION

To analyze fine foreign particles, to assemble microstructures or to study characteristics of a micro object, it has been necessary to manipulate a micro object with a micro-manipulator attached to a scanning electron microscope (SEM) or a transmission electron microscope (TEM). A relatively large object of about 100 $\mu$m in size has been usually gripped by a micro-handling tool that looks like a tweezer and held by frictional force. If an object is as small as about 10 $\mu$m, it would not easily be released from a handling tool surface due to specific inter-surface adhesion force acting on the tool surface and the object surface. Moreover, such a micro-object needs not to be gripped because it can be held with enough force only by contacting with a tool. A tweezer-like tool has therefore not very useful with regard to a micro-object.

Conventional techniques have employed a needle-shaped handling tool and used attractive or repulsive electrostatic forces to pick up or release objects while controlling the potentials of the tool and the work substrate. Generally, applying a positive voltage to the handling tool enables pick-up because the object is negatively charged by electron beam irradiation. To place the object on the work substrate, applying a negative voltage to the tool and a positive voltage to the substrate will release the object from the tool with high repeatability.

Conventional techniques enable relatively good repeatability of pick-and-release control when objects are negatively charged by electron beam irradiation, but these techniques have been applicable only under limited conditions.

For example, when a size of an object is as small as several micrometers, its charge state changes and lowers the repeatability of pick-and-release control. When such charge state change occurs, the operation must be repeated for many times to achieve the desired result, or the pick-up and release are completely disabled, making it impossible to accomplish the work.

The object of this invention is to provide a micro-manipulation method for handling a micro-object of several micrometers or less in size and to achieve excellent repeatability, and thereby to solve the above-noted problems.

DISCLOSURE OF THE INVENTION

The technical solution adopted by this invention is as follows:

A micro-manipulation method for handling micro-objects with a micro-handling tool while under the electron beam irradiation of an electron microscope, wherein the accelerating voltage of the electron beam, the potential of the micro-handling tool and the potential of a work substrate are adjusted to enable pick-up and release of micro-objects with the micro-handling tool.

In the micro-manipulation method, the accelerating voltage of an electron beam and the size of a micro-object may have a relationship that makes the electron beam penetrate the micro-object.

Further in the micro-manipulation method, the work substrate may be a conductive glass substrate that is coated with a thin polymer film to increase adhesion forces between the object and the substrate. Further in the micro-manipulation method, the work substrate may be a glass substrate on which a thin ITO (indium Tia oxide) film, or a transparent conductive electrode, is evaporated and a thin polystyrene film is then dip-coated on the top thereof to increase adhesion forces between the object and the substrate.

BEST MODE FOR CARRYING OUT THE INVENTION

Figure 1:
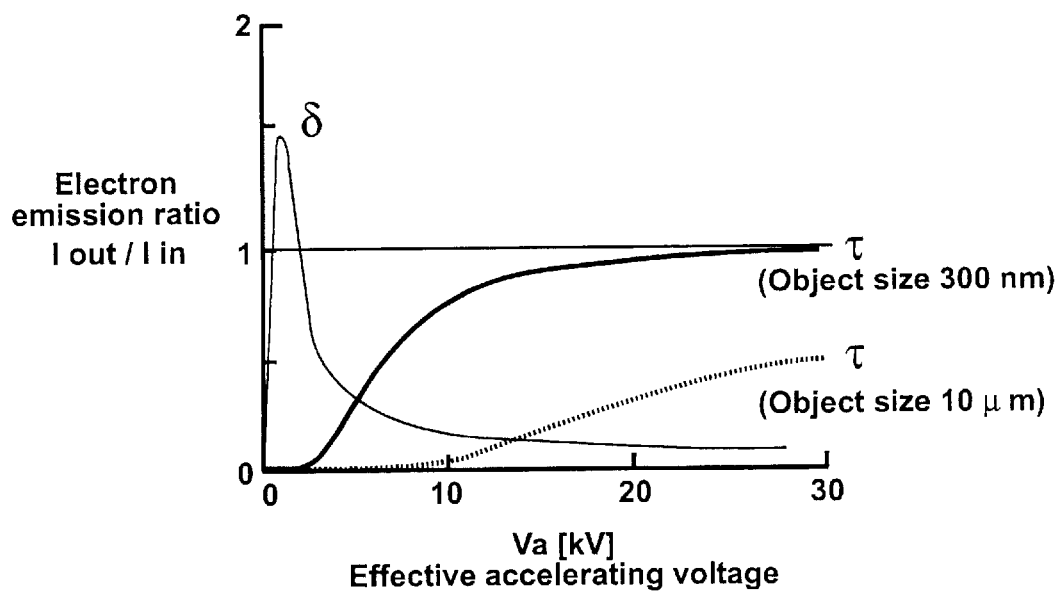
FIG. 1 illustrates the relationships between the effective accelerating voltage Va and the secondary electron emission ratio $\delta$ and the transmitted electron emission ratio $\tau$.
Figure 2:
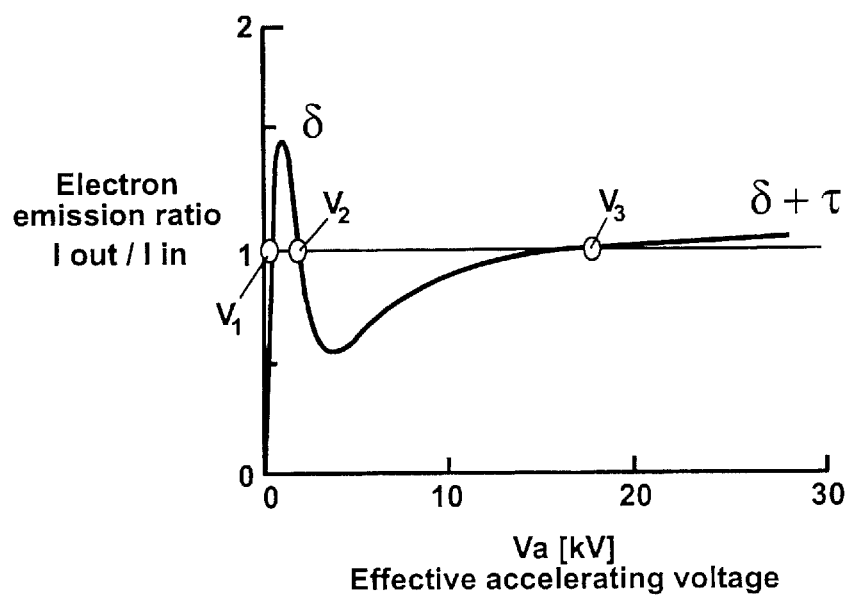
FIG. 2 illustrates the relationship between the effective accelerating voltage Va and the electron emission ratio $\delta+\tau$ of a micro-object of several micrometers or less.
Figures 3, 4:
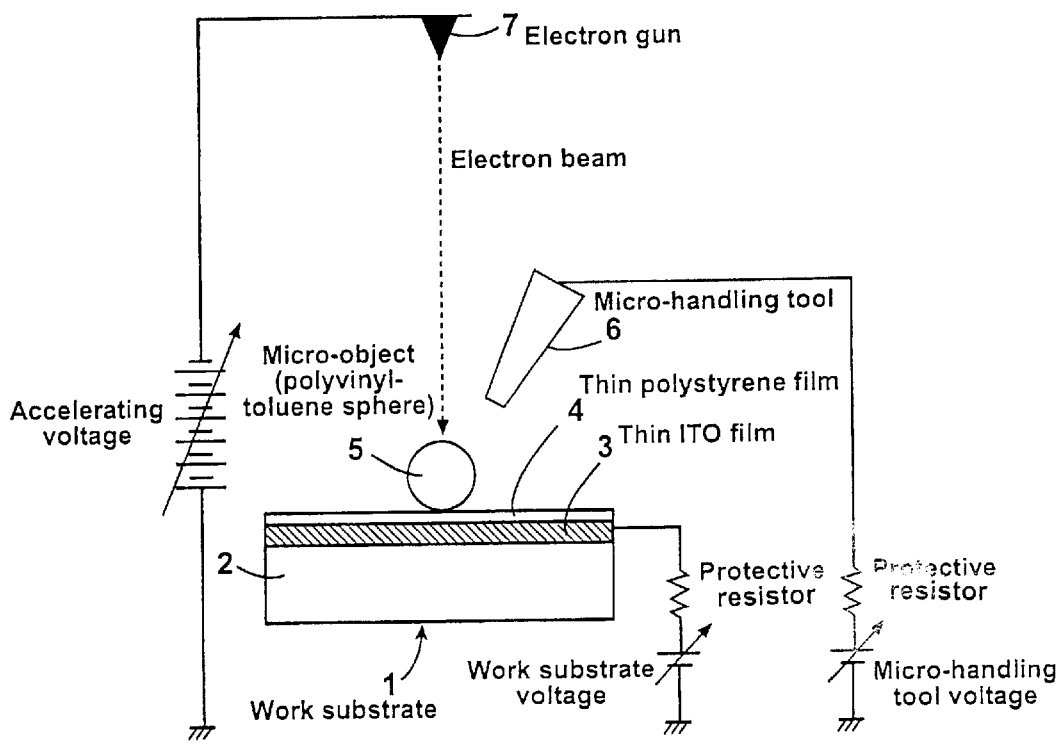
FIG. 3 is a table that shows the relationships between the accelerating voltages and charge polarities of micro-objects.
FIG. 4 illustrates an example of a micro-sphere, multilayer arrangement work performed for optical experimentation under an SEM.

The following describes the micro-manipulation method concerned with this invention. FIG. 1 illustrates a general relationship between the effective accelerating voltage Va, which is determined by the electron beam accelerating voltage and the object's potential, and the electron emission ratio Iout/Iin, which is the ratio of electrons emitted by the micro-object. FIG. 2 illustrates $\delta+\tau$, that is, the sum of the secondary electron emission ratio and the transmitted electron emission ratio. FIG. 3 is a table that shows the relationships between the accelerating voltages and charge polarities. In FIG. 1, when the electron emission rate equals 1, this means that the object emits exactly the same quantity of electrons as the beam of electrons that have passed the object.

Electrons entering an object are generally emitted from the object in the form of secondary electrons or transmitted electrons. As the effective accelerating voltage Va becomes larger, the secondary electron emission ratio $\delta$ first increases sharply, then exceeds 1 and reaches the maximum value. Thereafter, the ratio $\delta$ drops rapidly, then slowly decreases nearly to 0. The transmitted electron emission ratio $\tau$, on the other hand, increases gradually as Va becomes larger, then the ratio increases nearly to 1. Because secondary electrons are generated on the very surface layer of the matter, they are hardly affected by the object's size. The transmitted electrons are affected exponentially by the object's size.

The broken line in FIG. 1 indicates the transmitted electron emission ratio of an ordinary object of 10 $\mu$m in size. With such a large object, the transmitted electrons are almost negligible in the accelerating voltage range (about 30 kV) of an ordinary SEM. At this time, electrons entering object are not significantly released as secondary electrons or transmitted electrons, so the object is charged negatively. For this reason, conventional techniques enable manipulation of large objects with good repeatability.

The solid curve in FIG. 1 shows the transmitted electron emission ratio of an ordinary object of 300 nm in size. The influence of transmitted electrons is not negligible with such a small object.

FIG. 2 indicates δ+τ, that is, the sum of the secondary electron emission ratio and the transmitted electron emission ratio. In this case, the charge polarity of the object varies with the effective accelerating voltage Va. In FIG. 2, δ+τ becomes 1 at three points. Assuming that the effective accelerating voltage Va has values V1, V2 and V3 at these three points, objects carry no charge when the accelerating voltage is set to one of these values. At other values, objects are charged either positively or negatively. The accelerating voltage equals the effective accelerating voltage Va only when it is V1, V2 or V3 because objects have a potential of 0 V at these values. In any other circumstances, the accelerating voltage differs from the effective accelerating voltage Va.

FIG. 3 shows the relationship described above. To control the charge state of an object, an effective accelerating voltage can be selected from this table. The actual V1, V2 and V3 values vary with the materials and shapes of objects. However, these values can be easily learned from the way secondary electron images appear at different accelerating voltages. Images suddenly darken when the charge turns positive or lighten when the charge turns negative. These values can also be easily learned from responses to manipulation. Such responses are characteristics of adhesion to or release from the handling tool while a voltage is applied.

By utilizing the above-noted general properties of objects and selecting the electron beam accelerating voltage, handling tool potential and work substrate potential in the proper combination, this invention makes possible the highly repeatable pick-up and release of micro-objects sized several micrometers or less with a micro-handling tool.

Referring to FIG. 4, the following describes an example of a micro-sphere having a predetermined size, multi-layer arrangement work performed for optical experimentation under a SEM. FIG. 4 is a schematic drawing of the SEM.

In the SEM used here, the accelerating voltage can be selected from a range up to 30 kV. The work substrate 1 is made of a conductive glass substrate 2 that is coated with a thin polymer film to increase the adhesion force between the object and the substrate. In a further embodiment, a thin ITO film 3 (189 nm thick), or a transparent conductive electrode, is evaporated on the glass substrate 2, which is then dip-coated with a thin polystyrene film 4 (15 nm thick) to increase the adhesion force between the object and the substrate. As long as similar structures are available, various other methods may be used to make the glass substrate conductive and various types of polymer film may be applied to increase the adhesion force. The object of manipulation in this example is a polyvinyltoluene micro-sphere 5 with a diameter of 2 μm. The micro-sphere is manipulated with a micro-handling tool 6, which is a tapered glass pipette that is sputter-coated with a gold layer and has a tip diameter of 0.7 μm. The substrate 1 is attached to the specimen stage and the micro-handling tool 6 is attached to the work arm of the manipulator. The operator controls the manipulator with a joy stick, while viewing SEM images on a monitor. Because the micro-handling tool 6 and the work substrate 1 are individually connected to a variable power source via a protective resistor (1 MΩ), the operator can control their potentials arbitrarily.

In this experiment, with an accelerating voltage of 10 KV used for ordinary work, the micro-sphere could not be picked up from the substrate even when positive voltages ranging up to 70 V or a negative voltage was applied to the micro-handling tool 6 even though the substrate was grounded. This is partly because the substrate surface is covered with a coating to increase adhesion with the micro-sphere 5. Another reason is that the V3 value is about 10 KV for the micro-sphere 5, so the sphere carries little charge when 10 KV is applied. When the accelerating voltage was increased to the maximum 30 kV and −35 V was applied to the micro-handling tool 6, the micro-sphere 5 could be picked up from the grounded substrate with an about 50% probability of success. To release the micro-sphere 5 from the micro-handling tool 6 and place it on the work substrate 1, it was only necessary to simply ground the micro-handling tool 6 again and bring the micro-sphere 5 in contact with the substrate. Manipulation could be performed as desired with an about 90% probability of success. At this time, the same result was obtained when the handling tool was grounded and +35 V was applied to the work substrate. These results indicate that the sphere was charged positively. Lowering the accelerating voltage to 25 KV resulted in a pick-up failure when the micro-handling tool 6 and the work substrate 1 were at the same potentials. It is understood from this fact that the accelerating voltage clearly exerts an influence and plays an important role in determining the success and failure of manipulation.

It is difficult to manipulate micro-objects of several micrometers or smaller only by controlling the potentials of the micro-handling tool and the work substrate. As stated above, this invention easily realizes the pick-up and release of such small micro-objects with excellent repeatability, simply by controlling the accelerating voltage.

The work substrate used in the aforementioned embodiment may of course be replaced with a work substrate having similar functions. Various other embodiments are also possible within the spirit and scope of this invention. The embodiments noted previously are merely examples and they not to be interpreted in a restricted manner. All modifications and alterations within a range equivalent to the scope of the following Claims are meant to be included in this invention.

Industrial Field of Application

As described above in detail, to enable effective micro-manipulation performed by a micro-manipulator attached to an SEM or a TEM for the purpose of micro-matter analysis or microstructure assembly, this invention makes possible the desired manipulation of micro-objects as small as several micrometers or less in size and it does so with excellent repeatability.

What is claimed is:

1. A micro-manipulation method for manipulating a micro-object with a micro-handling tool under electron beam irradiation of an electron microscope, wherein said method comprises steps of:

adjusting accelerating voltage of the electron beam, a first potential of the micro-handling tool and a second potential of a work substrate; and picking up and releasing the micro-object with the micro-handling tool.

2. A micro-manipulation method according to claim 1, wherein said micro-object has a predetermined size, and the accelerating voltage of the electron beam is adjusted to make the electron beam penetrate the micro-object in the predetermined size.

3. A micro-manipulation method according to claim 1 or 2, said method further comprises a step of:

preparing the work substrate by providing a conductive glass substrate and coating a polymer film on the conductive glass substrate, whereby the adhesion force between the micro-object and the substrate is increased.

4. A micro-manipulation method according to claim 1 or 2, said method further comprises a step of:

preparing the work substrate by providing a glass substrate, evaporating an ITO film of a transparent conductive electrode on the glass substrate, and dip-coating a polystyrene film, whereby increasing an adhesion force between the micro-object and the work substrate.

* * * * *

UNITED STATES PATENT AND TRADEMARK OFFICE
CERTIFICATE OF CORRECTION

PATENT NO. : 6,580,076 B1
DATED : June 17, 2003
INVENTOR(S) : Hieki Miyazaki and Tomomasa Sato It is certified that error appears in the above-identified patent and that said Letters Patent is hereby corrected as shown below:

<u>Title page,</u>
Item [75], Inventors, should read as:
-- [75] Inventor: Hideki Miyazaki, Ibaraki (JP) and Tomomasa Sato, Chiba (JP) --

Signed and Sealed this

Seventeenth Day of February, 2004

JON W. DUDAS
*Acting Director of the United States Patent and Trademark Office*